US011822384B2

(12) United States Patent
Lee

(10) Patent No.: US 11,822,384 B2
(45) Date of Patent: *Nov. 21, 2023

(54) DISPLAY DEVICE

(71) Applicant: SAMSUNG DISPLAY CO., LTD., Yongin-si (KR)

(72) Inventor: Junghun Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/817,760

(22) Filed: Aug. 5, 2022

(65) Prior Publication Data

US 2022/0390984 A1 Dec. 8, 2022

Related U.S. Application Data

(63) Continuation of application No. 17/012,743, filed on Sep. 4, 2020, now Pat. No. 11,449,095.

(30) Foreign Application Priority Data

Dec. 31, 2019 (KR) ........................ 10-2019-0178832

(51) Int. Cl.
*G06F 1/16* (2006.01)
*H10K 50/84* (2023.01)
*H10K 59/00* (2023.01)

(52) U.S. Cl.
CPC .......... *G06F 1/1616* (2013.01); *G06F 1/1626* (2013.01); *H10K 50/84* (2023.02); *H10K 59/00* (2023.02)

(58) Field of Classification Search
CPC ............................ G06F 1/1616; G06F 1/1626
See application file for complete search history.

(56) References Cited

U.S. PATENT DOCUMENTS

| 6,735,481 | B1 | 5/2004 | Bingham et al. |
| 9,176,535 | B2 | 11/2015 | Bohn et al. |
| 9,827,742 | B2 | 11/2017 | Kim et al. |
| 10,186,684 | B2 | 1/2019 | Chun |
| 10,217,950 | B2 | 2/2019 | Joo et al. |

(Continued)

FOREIGN PATENT DOCUMENTS

| KR | 10-0736467 | | 6/2007 | |
| KR | 20150034555 | A * | 4/2015 | ............... G09F 9/00 |

(Continued)

*Primary Examiner* — Abhishek M Rathod
(74) *Attorney, Agent, or Firm* — F. CHAU & ASSOCIATES, LLC

(57) ABSTRACT

A display device includes a display module, a plurality of joint units, and a mesh pattern layer. The display module includes a first non-folding region, a second non-folding region, and a folding region disposed between the first non-folding region and the second non-folding region. The plurality of joint units are disposed under the display module, overlapped with the folding region, and sequentially arranged in a first direction. The mesh pattern layer is disposed between the display module and the plurality of joint units and includes a mesh pattern and a plurality of openings defined by the mesh pattern. Therefore, the display device according to an embodiment of the inventive concept may have excellent visibility.

18 Claims, 17 Drawing Sheets

(56) References Cited

U.S. PATENT DOCUMENTS

| | | |
|---|---|---|
| 2008/0284971 A1 | 11/2008 | Park et al. |
| 2015/0029652 A1* | 1/2015 | Min ................... H05K 1/0278 |
| | | 361/679.27 |
| 2015/0314561 A1 | 11/2015 | Kim et al. |
| 2016/0118616 A1 | 4/2016 | Hiroki et al. |
| 2017/0263890 A1 | 9/2017 | Chun |
| 2018/0102496 A1 | 4/2018 | Kim et al. |
| 2018/0164931 A1 | 6/2018 | Na et al. |
| 2018/0192527 A1 | 7/2018 | Yun et al. |
| 2018/0307338 A1 | 10/2018 | Park |
| 2018/0308903 A1 | 10/2018 | Jeong et al. |
| 2018/0341293 A1 | 11/2018 | Kim |
| 2019/0082544 A1 | 3/2019 | Park |
| 2019/0101784 A1 | 4/2019 | Shin et al. |
| 2020/0257335 A1 | 8/2020 | Kim et al. |
| 2021/0200268 A1 | 7/2021 | Lee |

FOREIGN PATENT DOCUMENTS

| | | |
|---|---|---|
| KR | 10-2015-0125888 | 11/2015 |
| KR | 10-2016-0042288 | 4/2016 |
| KR | 10-2017-0057500 | 5/2017 |
| KR | 10-2017-0106558 | 9/2017 |
| KR | 10-1955050 | 2/2019 |

\* cited by examiner

DISPLAY DEVICE

CROSS-REFERENCE TO RELATED APPLICATIONS

This U.S. non-provisional patent application claims priority to Korean Patent App. No. 10-2019-0178832, filed on Dec. 31, 2019, and to U.S. application Ser. No. 17/012,743, filed on Sep. 4, 2020, the contents of which are hereby incorporated by reference in their entirety.

BACKGROUND

The present disclosure herein relates to a display device, and more particularly, to a foldable display device.

Smartphones, digital cameras, laptop computers, navigation devices, and smart televisions are examples of electronic devices. Electronic devices may include a display panel to convey information by displaying an image to a user.

In the case of smartphones, demand for larger displays has caused an increase in the size of the devices. However, larger smartphones may be less convenient to hold or carry.

Flexible or foldable display devices have been developed to reduce the size of an electronic device by folding the device to a fraction of the unfolded size. However, if the device is folded repeatedly, over time a folding region may develop creases, wrinkles or other signs of degradation. Therefore, there is a need in the art for systems and methods to reduce the effects of folding on the folding region of a display device.

SUMMARY

The present disclosure relates to a display device.

An embodiment of the inventive concept provides a display device including a display module, a plurality of joint units, and a mesh pattern layer. The display module includes a first non-folding region, a second non-folding region, and a folding region disposed between the first non-folding region and the second non-folding region. The plurality of joint units are disposed under the display module, overlapped with the folding region, and sequentially arranged in a first direction. The mesh pattern layer is disposed between the display module and the plurality of joint units. The mesh pattern layer includes a mesh pattern and a plurality of openings defined by the mesh pattern.

In an embodiment, the mesh pattern may be defined by a plurality of first yarns extending in the first direction and a plurality of second yarns each extending crosswise with the plurality of first yarns. In an embodiment, the mesh pattern may be defined by a plurality of first yarns extending in a direction crossing the first direction at an angle of about 30 to about 60 degrees and a plurality of second yarns each extending crosswise with the plurality of first yarns.

In an embodiment, a thickness of the mesh pattern layer may be about 80 micrometers to about 150 micrometers. In an embodiment, at least one of the plurality of joint units may have a predetermined step with a neighboring joint unit at least one of the plurality of joint units. An area of each of the plurality of openings may be about (an average step of the joint units×0.95)$^2$ to about (the average step of the joint units×1.3)$^2$.

In an embodiment, each of the plurality of openings may have the same shape and area in a plan view. In an embodiment, the mesh pattern layer may be overlapped with the folding region and the non-folding region. In an embodiment, the mesh pattern layer may be overlapped with the folding region and may not be overlapped with the non-folding region.

In an embodiment, each of the plurality of first yarns and the plurality of second yarns may have a modulus of about 3 GPa to about 4 GPa. In an embodiment, each of the plurality of first yarns and the plurality of second yarns may include polyethylene terephthalate (PET), polyetheretherketone (PEEK), polyaniline (PA), and polypropylene (PP).

In an embodiment, the display device may further include at least one of a film layer or a cushion layer disposed between the display module and the plurality of joint units. In an embodiment, the display device may further include a film layer disposed between the display module and the plurality of joint units. The mesh pattern layer may be disposed under the film layer.

In an embodiment, the display device may further include a cushion layer disposed between the display module and the plurality of joint units. The mesh pattern layer may be disposed over the cushion layer. In an embodiment, the display module may include a display element layer, a thin-film encapsulation layer encapsulating the display element layer, and an input sensing layer disposed directly on the thin-film encapsulation layer. In an embodiment, the plurality of joint units may be spaced apart from each other at regular intervals.

In an embodiment, the display device may further include a window. The window may be disposed over the display module and may include a first non-folding portion overlapped with the first non-folding region, a second non-folding portion overlapped with the second non-folding region, and a folding portion overlapped with the folding region. The folding portion may be folded and a display surface of the first non-folding portion and a display surface of the second non-folding portion may be exposed to the outside.

In an embodiment of the inventive concept, a display device includes a window, a display module, and a mesh pattern layer. The window may include a folding portion, a first non-folding portion, and a second non-folding portion, the first non-folding portion and the second non-folding portion being spaced apart from each other with the folding portion therebetween. The display module may be disposed under the window. The mesh pattern layer may include a mesh pattern and a plurality of openings. The mesh pattern layer may be disposed under the display module. The openings may be defined by the mesh pattern and may have the same shape and the same area. The mesh pattern may be defined by a plurality of first yarns extending in a first direction and a plurality of second yarns each extending crosswise with the plurality of first yarns.

In an embodiment, the display device may be operated in at least one of a first operation mode or a second operation mode. The first operation mode may be an operation mode in which a display surface of the first non-folding portion and a display surface of the second non-folding portion face each other while the folding portion is folded. The second operation mode may be an operation mode in which the display surface of the first non-folding portion and the display surface of the second non-folding portion are exposed to the outside while the folding portion is folded.

In an embodiment, the display device may further include a plurality of joint units. The plurality of joint units may be overlapped with the folding portion and may be disposed under the mesh pattern. In an embodiment, the plurality of joint units may include a first joint unit, and a second joint unit having a step with the first joint unit. An area of each of the plurality of openings is about (the first step×0.95)² to about (the first step×1.3)².

In an embodiment of the inventive concept, a display device includes a display module and a mesh pattern layer. The display module includes a folding region, and a non-folding region adjacent to the folding region. The mesh pattern layer is disposed under the display module and may include a mesh pattern and an opening. The opening is defined by the mesh pattern. The mesh pattern may be defined by a plurality of first yarns extending in a first direction and a plurality of second yarns each extending crosswise with the plurality of first yarns. An m-th first yarn of the first yarns is disposed over an n-th second yarn of the second yarns and under an (n+1)-th second yarn of the second yarns. Alternatively, the m-th first yarn of the first yarns is disposed under the n-th second yarn of the second yarns and over the (n+1)-th second yarn of the second yarns. An (m+1)-th first yarn of the first yarns is disposed over the n-th second yarn of the second yarns and under the (n+1)-th second yarn of the second yarns. Alternatively, the (m+1)-th first yarn of the first yarns is disposed under the n-th second yarn of the second yarns and over the (n+1)-th second yarn of the second yarns. Here, m and n are each an odd number equal to or greater than 1.

In an embodiment, the shortest distance between a top of the first yarn and a bottom of the second yarn in an overlapping portion of the first yarn and the second yarn may be about 80 micrometers to about 150 micrometers. In an embodiment, the display device may further include a plurality of joint units. The plurality of joint units may be disposed under the mesh pattern layer and may be overlapped with the folding region.

An embodiment of the present disclosure includes a display device comprising a display module; a plurality of joints disposed under the display module, and configured to support folding of the display device; and a mesh pattern layer disposed between the display module and the joints, wherein the mesh pattern comprises a mesh pattern and a plurality of openings defined by the mesh pattern, and wherein the openings have an average size between a lower value determined based on a visibility parameter and an upper value determined based on an adhesion parameter.

BRIEF DESCRIPTION OF THE FIGURES

The accompanying drawings are included to provide a further understanding of the inventive concept and are incorporated in and constitute a part of the present disclosure. The drawings illustrate exemplary embodiments of the inventive concept and, together with the description, serve to explain principles of the inventive concept. In the drawings.

DETAILED DESCRIPTION

Figure 1A:
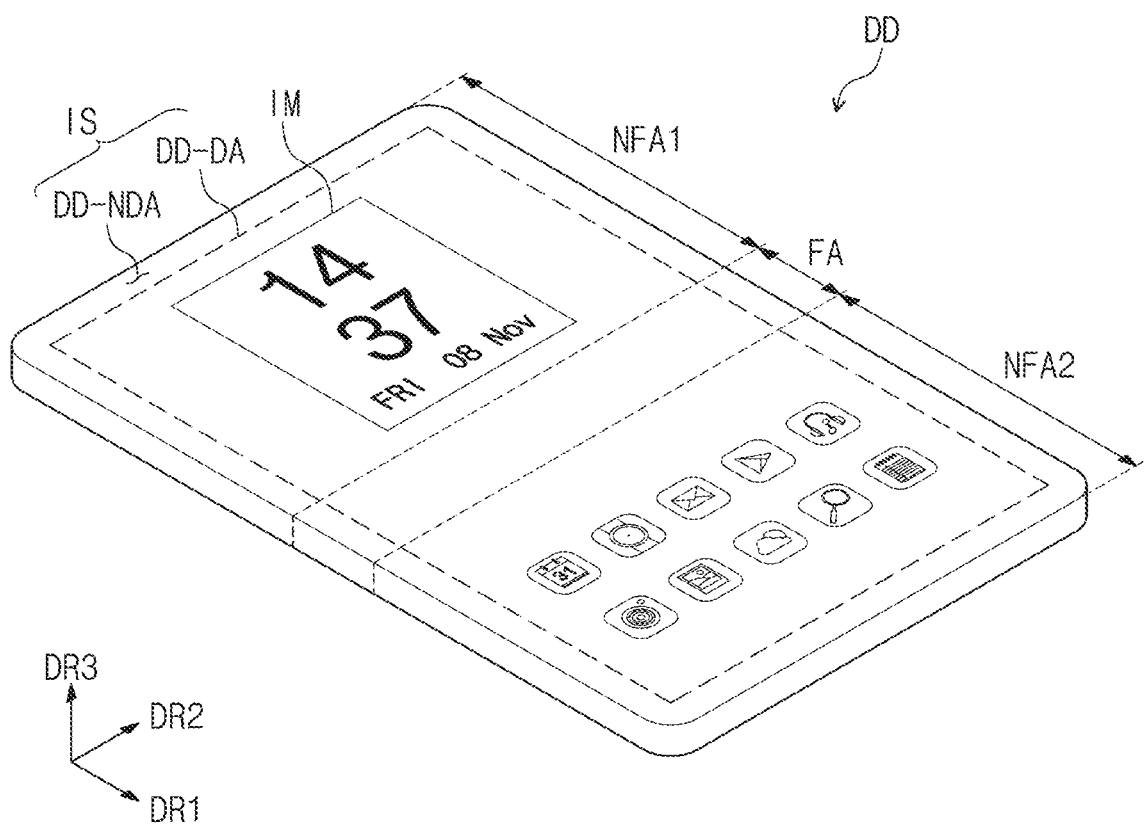
FIG. 1A is a perspective view illustrating a display device according to an embodiment of the inventive concept in a first operation.

Flexible display devices may be deformed in a curved shape or may be folded or rolled. The flexible display devices capable of being deformed into various shapes are easy to carry and may increase convenience of users.

Among the flexible display devices, a foldable display device is folded about a folding axis extending in one or more directions. Visibility may deteriorate at a folding portion after repeated folding operations over the life of the device. For example, wrinkles generated when the device is folded may be visually recognized or joint units that are disposed in the folding portion may be visually recognized.

The display device of the present disclosure includes a mesh pattern layer disposed between a display module and a plurality of joint units and includes a mesh pattern and a plurality of openings defined by the mesh pattern. Through the mesh pattern layer, a problem in which wrinkles or multi-joint hinges occurring in the folding portion are recognized can be reduced.

In the present disclosure, it will be understood that when an element (or region, layer, part, or the like) is referred to as being "on", "connected to" or "coupled to" another element, the element can be directly on, connected or coupled to the other element or layer or intervening elements or layers may be present.

Like numbers refer to like elements throughout. In the drawings, the thicknesses, the ratios and the dimensions of the elements are exaggerated for effective description of the technical contents.

As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. For example, without departing from the teachings of the present invention, a first element could be termed a second element, and similarly, a second element could be termed a first element. The singular forms, "a", "an" and "the" are intended to include the plural forms as well, unless the context clearly indicates otherwise.

Terms, such as "beneath", "below", "lower", "over", "upper" and the like, may be used herein for ease of description to describe one element or feature's relationship to another element(s) or feature(s) as illustrated in the figures. It will be understood that the terms are spatially relative terms and are to be described with reference to the orientation depicted in the figures.

Additionally or alternatively, the term "on" in the present disclosure may include the case where an element or a feature is disposed at the lower part bottom as well as the upper part.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted with a meaning consistent with their meaning in the context of the relevant art and will be interpreted expressly as being defined in the present disclosure unless interpreted in an idealized or overly formal sense.

It will be further understood that the terms "includes" and/or "including", when used in the present disclosure, specify the presence of stated features, integers, steps, operations, elements, and/or components, but do not preclude the presence or addition of one or more other features, integers, steps, operations, elements, components, and/or groups thereof.

Hereinafter, embodiments of the present invention will be described with reference to the drawings.

Figure 1B:
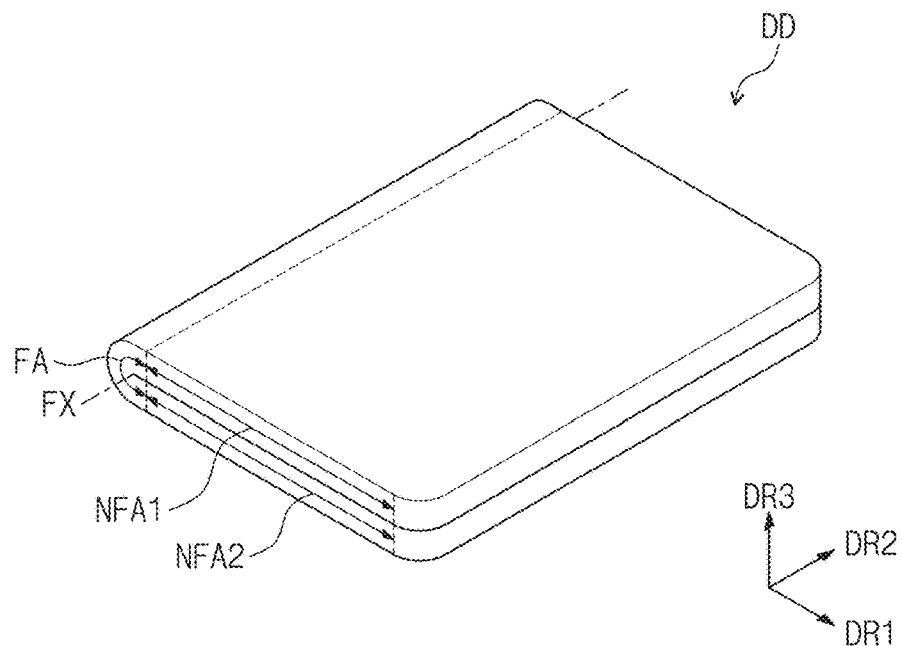
FIG. 1B is a perspective view illustrating the display device according to an embodiment of the inventive concept in a second operation.
Figure 1C:
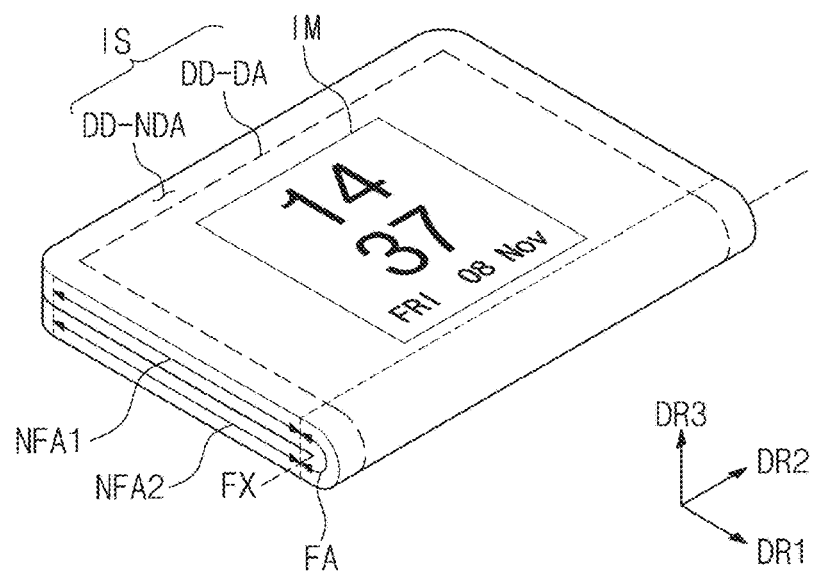
FIG. 1C is a perspective view illustrating the display device according to an embodiment of the inventive concept in a third operation.

FIG. 1A is a perspective view illustrating a display device DD according to an embodiment of the inventive concept in a first operation mode. FIG. 1B is a perspective view illustrating the display device DD according to an embodiment of the inventive concept in a second operation mode. FIG. 1C is a perspective view illustrating the display device DD according to an embodiment of the inventive concept in a third operation mode.

As illustrated in FIG. 1A, in the first operation mode, a display surface IS on which an image IM is displayed is parallel to the surface defined by a first direction axis DR1 and a second direction axis DR2. A third direction axis DR3 indicates the normal direction of the display surface IS, i.e., the thickness direction of the display device DD. The front surface (or top surface) and the back surface (or bottom surface) of each member are distinguished from each other by the third direction axis DR3. However, the directions indicated by the first to third direction axes DR1, DR2 and DR3 are relative concepts. Therefore, the directions may be converted to other directions. Hereinafter, the first to third directions are directions indicated by the first to third direction axes DR1, DR2, and DR3, respectively, and refer to the same reference numerals. In the present disclosure, the expression "when viewed in a plan view" means that the structure under consideration is observed in the third direction DR3.

FIGS. 1A to 1C illustrate the foldable display device DD as an example of a flexible display device DD. However, the display device, according to the embodiment of the inventive concept, may be a rollable display device DD, which is rolled up, or a bendable display device DD, and is not particularly limited. The flexible display device DD, according to the embodiment of the inventive concept, may be used in large electronic devices such as a television or a monitor, and may also be used in small and medium electronic devices such as a mobile phone, a tablet, a car navigation device, a game machine, and a smartwatch. Hereinafter, the display device DD is described as the foldable display device DD.

As illustrated in FIG. 1A, the display surface IS of the display device DD may include a plurality of regions. The display device DD includes a display region DD-DA on which the image IM is displayed, and a non-display region DD-NDA adjacent to the display region DD-DA. The non-display region DD-NDA is a region on which the image IM is not displayed. In FIG. 1A, a clock widget is illustrated as an example of an image IM. As an example, the display region DD-DA may have a rectangular shape. The non-display region DD-NDA may surround the display region DD-DA. However, the shape of the display region DD-DA and the shape of the non-display region DD-NDA are not limited thereto, and may be relatively designed. In an embodiment, the non-display region DD-NDA may be omitted.

As illustrated in FIGS. 1A to 1C, the display surface IS of the display device DD may include a plurality of regions defined according to an operation type. The display device DD may include a folding region FA folded about a folding axis FX, and non-folding regions NFA1 and NFA2 that are not folded. The folding region FA may be disposed between the first non-folding region NFA1 and the second non-folding region NFA2. Although FIGS. 1A to 1C illustrate the display device DD including one folding region FA and two non-folding regions NFA1 and NFA2, the embodiment of the inventive concept is not limited thereto. For example, the display device DD may include one folding region and one non-folding region. Alternatively, the display device DD may include three or more non-folding regions and two or more folding regions. In this case, at least two folding axes FX may be defined.

As illustrated in FIG. 1B, the display device DD may be folded forward into itself (inner-bending) such that the display surfaces IS of the two non-folding regions NFA1 and NFA2 face each other. As illustrated in FIG. 1C, the display device DD may be folded behind itself (outer-bending) such that the display surfaces IS are exposed to the outside.

In an embodiment of the inventive concept, the display device DD may be operated in at least one of the operation modes illustrated in FIGS. 1A and 1B. The display device DD may be configured to repeat the operation modes illustrated in FIGS. 1A and 1B. However, the embodiment of the inventive concept is not limited thereto, and the folding region FA may be variously defined to correspond to the type of the user manipulating the display device DD. For example, unlike the FIGS. 1B and 1C, the folding region FA may be defined to be parallel to the first direction axis DR1, or may be defined in a diagonal direction.

When the display device DD includes two non-folding regions NFA, the areas of the non-folding regions NFA may be equal to each other, but the embodiment of the inventive concept is not limited thereto. The area of the non-folding region NFA may be larger than that of the folding region FA. In an embodiment, the area of the folding region FA is not fixed but may be determined according to the radius of curvature. In FIGS. 1A to 1C, a case where the display device DD is folded about a short axis is illustrated by way of example.

Figure 2A:
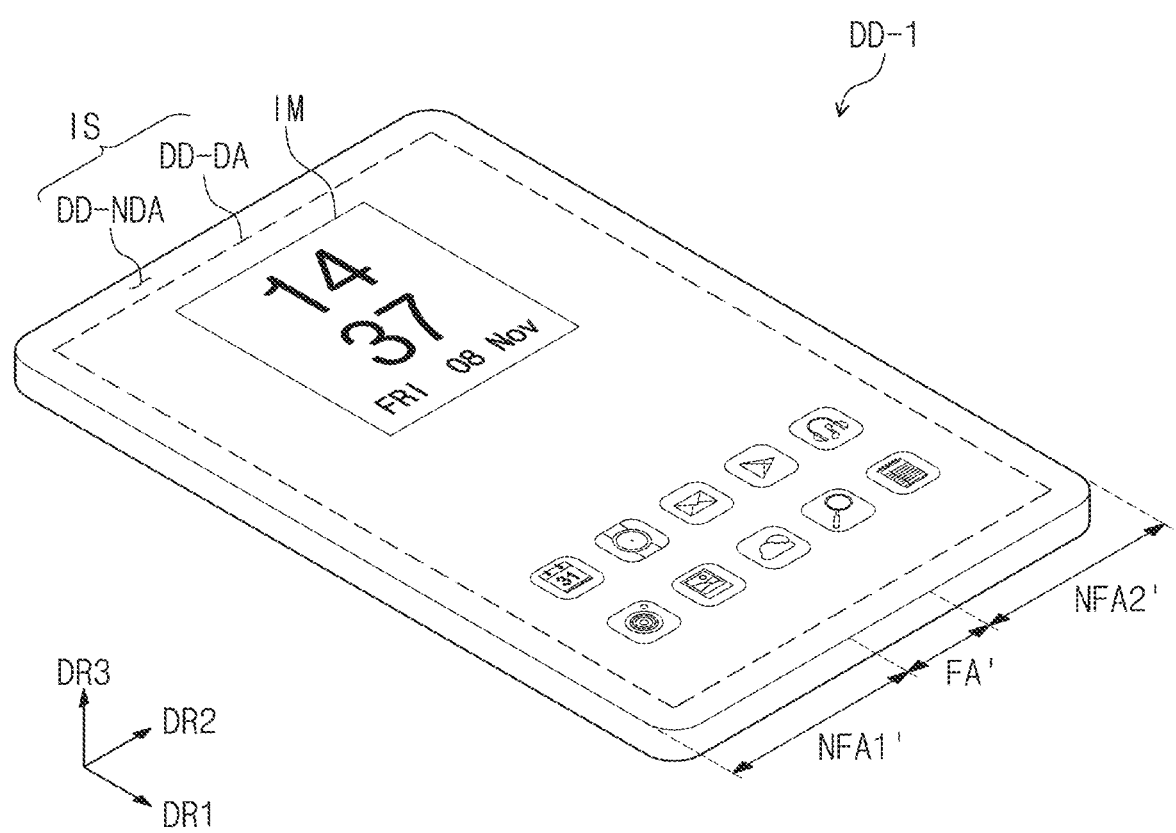
FIG. 2A is a perspective view illustrating a display device according to an embodiment of the inventive concept in a first operation.
Figure 2B:
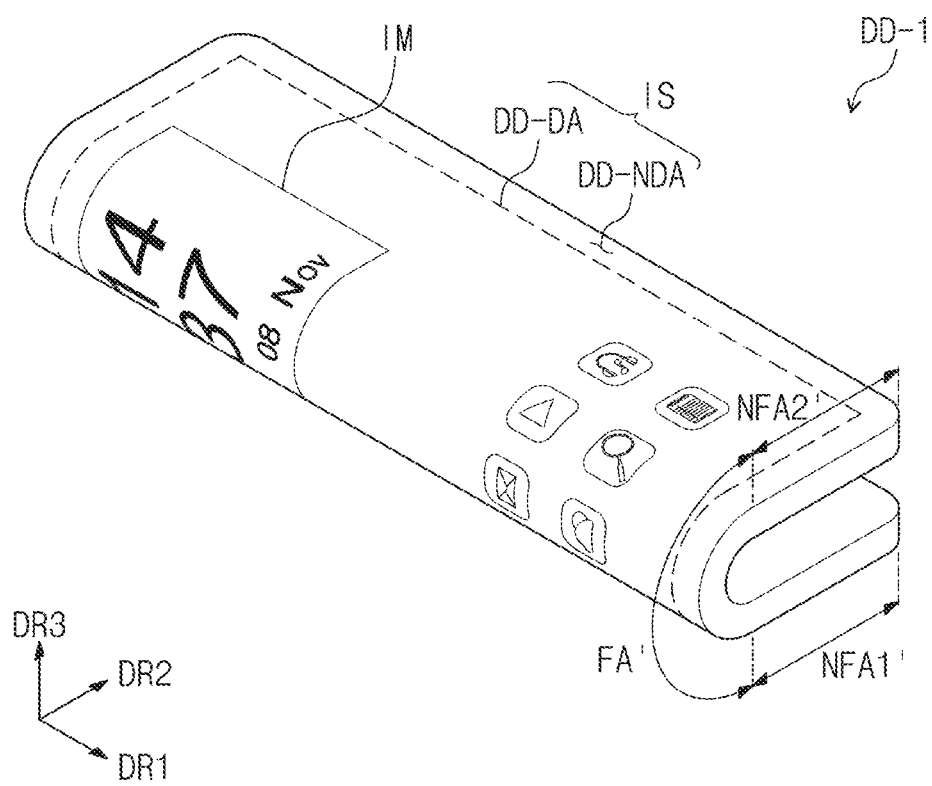
FIG. 2B is a perspective view illustrating the display device according to an embodiment of the inventive concept in a second operation.

FIG. 2A is a perspective view illustrating a display device DD-1 according to an embodiment of the inventive concept in a first operation. FIG. 2B is a perspective view illustrating the display device DD-1 according to an embodiment of the inventive concept in a second operation.

Referring to FIGS. 2A and 2B, the display device DD-1 may include a first non-folding region NFA1', a second non-folding region NFA2', and a folding region FA' disposed between the first non-folding region NFA1' and the second non-folding regions NFA2'. The first non-folding region NFA1', the second non-folding region NFA2', and the folding region FA' may be arranged in a second direction DR2.

The folding region FA' may be bent with respect to a folding axis FX' parallel to the first direction DR1, so that the display device DD-1 may be folded. The folding axis FX' may be defined as a long axis parallel to the long side of the display device DD-1. The same description as described with reference to FIGS. 1A to 1C may be applied to the display device DD-1 illustrated in FIGS. 2A and 2B except that the display device DD-1 is folded about the long axis thereof. For example, the display device DD-1 may be folded by outer-bending to expose the display surface IS to the outside. Although not illustrated, the display device DD-1 may be folded by inner-bending such that the display surfaces IS face each other.

Hereinafter, in the present disclosure, a case where the display device DD is folded about a short axis thereof will be described. However, it will be understood that the inventive concept, which will be described later, may also be applied to the display device DD-1 folded about the long axis.

Figure 3A:
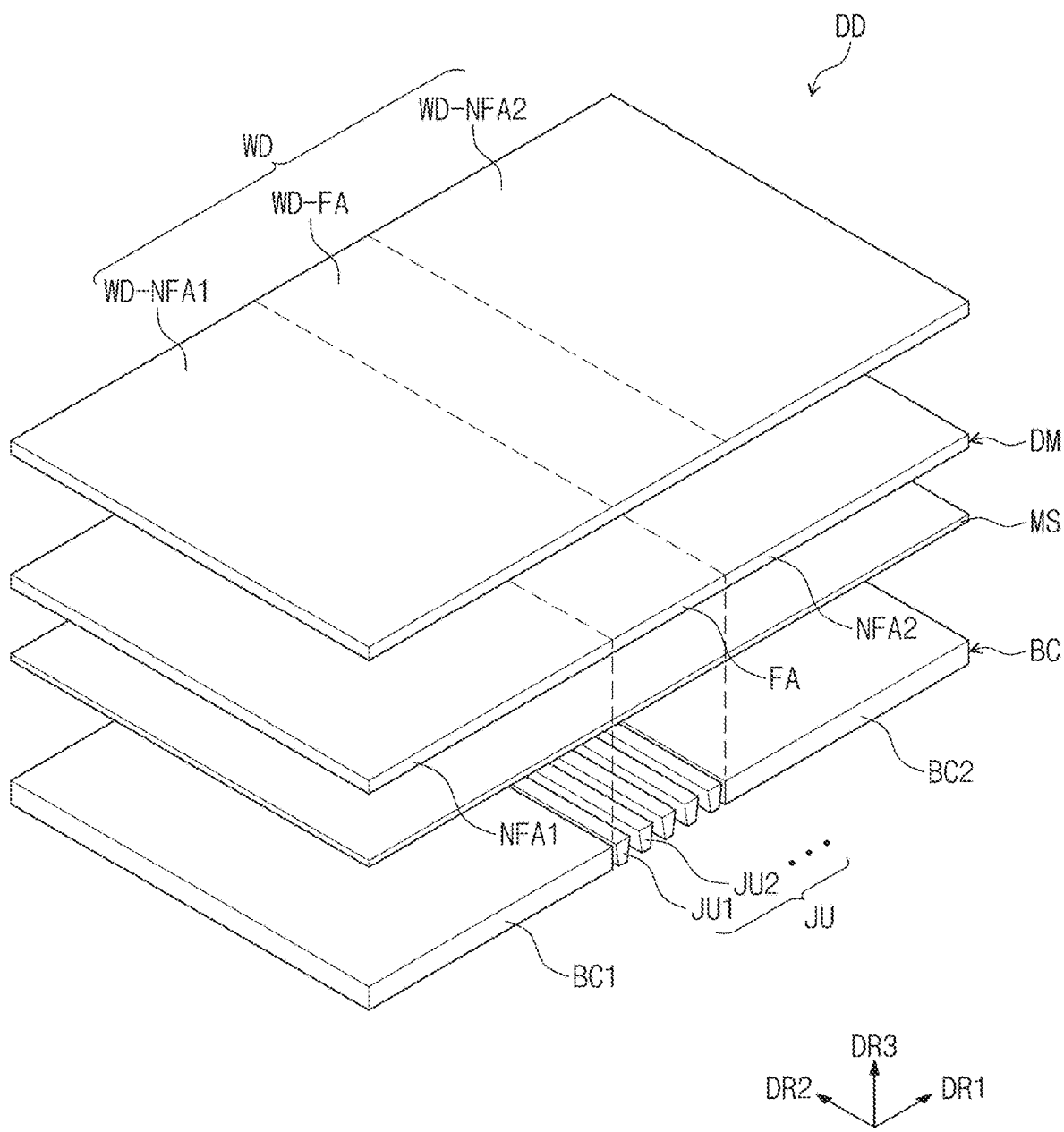
FIG. 3A is an exploded perspective view of a display device according to an embodiment of the inventive concept.
Figure 3B:
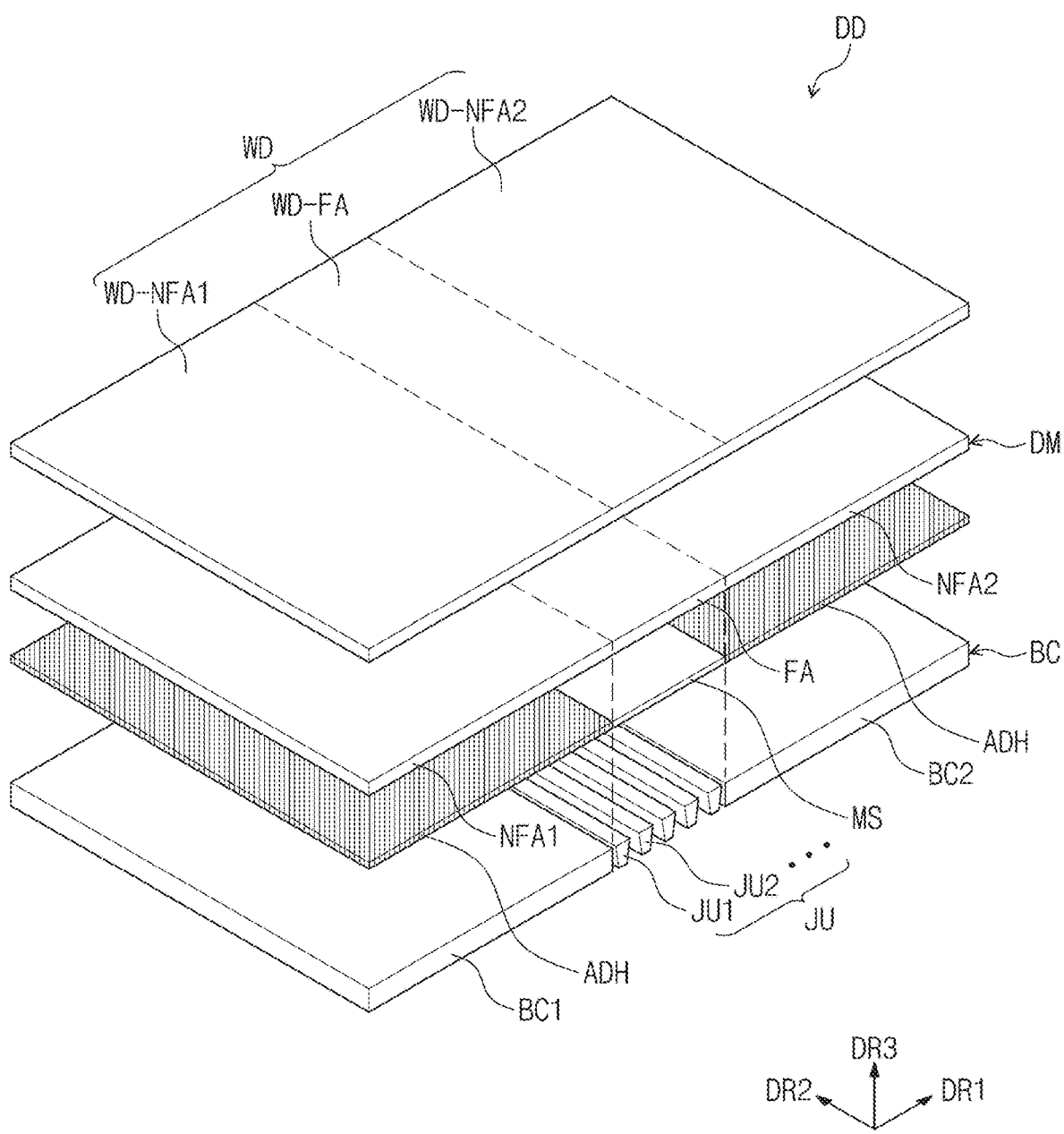
FIG. 3B is an exploded perspective view of a display device according to an embodiment of the inventive concept.

FIG. 3A is an exploded perspective view of a display device DD according to an embodiment of the inventive concept. FIG. 3B is an exploded perspective view of a display device DD according to an embodiment of the inventive concept.

Referring to FIGS. 3A and 3B, the display device DD according to the embodiments of the inventive concept may include a window WD, a display module DM, a mesh pattern layer MS, a plurality of joint units JU, and a lower cover BC. Although not illustrated, an adhesive layer may be disposed between the window WD and the display module DM. Additionally or alternatively, an adhesive layer may be disposed between the display module DM and the mesh pattern layer MS. An adhesive layer may be disposed between the plurality of joint units JU and the mesh pattern layer MS, and between the lower cover BS and the mesh pattern layer MS. The window WD may include a folding portion WD-FA and non-folding portions WD-NFA1 and WD-NFA2 spaced apart from each other with the folding portion WD-FA therebetween. The folding portion WD-FA may be overlapped with a folding region FA. The non-folding portions WD-NFA1 and WD-NFA2 may be overlapped. The upper surface of the window WD may be the display surface IS (FIG. 1) displaying an image. The window WD may contain glass or plastic. The window WD may be a thin film substrate of about 100 micrometers or less. Although not illustrated, a film for protecting the window WD may be further attached to the window WD.

The display module DM may be disposed under the window WD. As described in the display device DD, the display module DM may include a first non-folding region NFA1, a second non-folding region NFA2, and a folding region FA disposed between the first non-folding region NFA1 and the second non-folding regions NFA2. The first non-folding region NFA1, the second non-folding region NFA2, and the folding region FA may be arranged in the first direction DR1.

Referring to FIG. 3A, the mesh pattern layer MS may be disposed to be overlapped with the folding region FA and the non-folding regions NFA1 and NFA2. However, the embodiment is not limited thereto, and as illustrated in FIG. 3B, the mesh pattern layer MS may be disposed to be overlapped with the folding region FA and not to be overlapped with the non-folding regions NFA1 and NFA2. In an embodiment, when a plurality of folding regions FA are provided, the mesh pattern layer MS may be provided to be overlapped with the plurality of folding regions FA.

When the mesh pattern layer MS is not overlapped with the non-folding regions NFA1 and NFA2, an adhesive layer ADH may be disposed in the non-folding regions NFA1 and NFA2 instead of the mesh pattern layer MS. For example, the adhesive layer ADH may be disposed between lower covers BC1 and BC2 and the display module DM. The adhesive layer ADH may be an optically transparent adhesive layer. The optically transparent adhesive layer may be an optically transparent adhesive resin or an optically transparent adhesive tape. The adhesive layer may be a pressure-sensitive adhesive (PSA). The adhesive layer may contain, for example, an acrylic adhesive material.

The joint units JU may be disposed under the mesh pattern layer MS. The joint units JU may be overlapped with the folding region FA. The joint units JU may extend in the second direction DR2 and may be arranged in the first direction DR1. The joint units JU may be spaced apart from each other at regular intervals in the first direction DR1. The joint units JU may be disposed between the first lower cover BC1 and the second lower cover BC2. The joint units JU may be coupled to the mesh pattern layer MS by the adhesive layer to protrude downward.

With respect to the first direction DR1, the width of each of the joint units JU may become smaller from the top to the bottom of each of the joint units JU. For example, when viewed in the second direction DR2, each of the joint units JU may have a trapezoidal shape in which the length of the upper side is wider than that of the lower side. However, this is merely illustrative, and the joint units JU may have various shapes.

With respect to the third direction DR3, the joint units may have the same thickness as each of the first and second lower covers BC1 and BC2. However, this is merely illustrative, the thickness of each of the joint units JU may be different from the thickness of each of the first and second lower covers BC1 and BC2.

The lower cover BC may be disposed at the lowermost portion of the display device DD to accommodate members of the display device DD. The lower cover BC may include a first lower cover BC1, which is disposed under the mesh pattern layer MS and overlapped with the first non-folding region NFA1, and the second lower cover BC2, which is disposed under the mesh pattern layer MS and overlapped with the second non-folding region NFA2.

Although not illustrated, the display device DD may further include a hinge portion connected to the first and second lower covers BC1 and BC2. The hinge portion may be for providing the folding axis FX extending in the second direction DR2. The hinge portion can accommodate the joint units JU.

Figure 4:
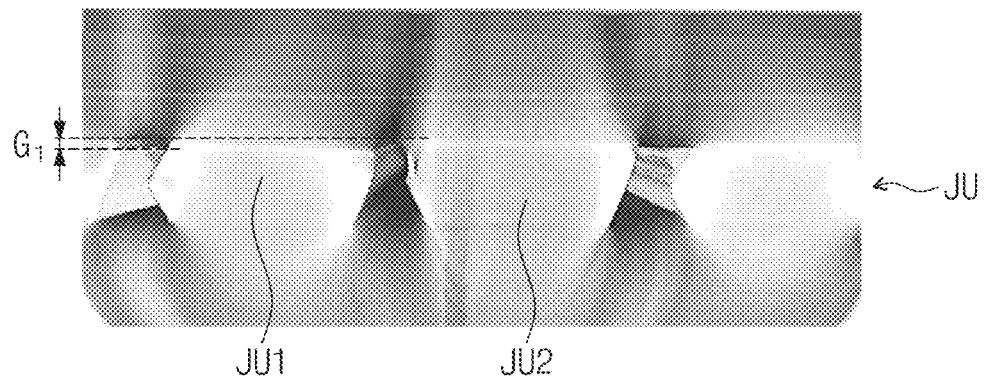
FIG. 4 is an enlarged view illustrating some of joint units according to an embodiment of the present invention.

FIG. 4 is an enlarged view illustrating some of joint units JU according to an embodiment of the inventive concept.

Referring to FIG. 4, in an embodiment, the joint units JU may include a first joint unit JU1 and a second joint unit JU2.

The upper component to which the joint units JU are adhered may have minute bending that may occur in the process. Additionally or alternatively, when the joint units JU are adhered, a difference may occur in the thickness of the adhesive layer between each of the joint units JU and the upper component. Accordingly, a step may occur between the joint units JU when each of the plurality of joint units JU adheres to the upper component.

Each of the joint units JU may have a predetermined step with a neighboring joint unit. For example, the first joint unit JU1 and the second joint unit JU2 may have a first step G1. As illustrated in FIG. 4, the first step G1 is defined as the shortest distance between the plane parallel to the upper surface of the first joint unit JU1 and the plane parallel to the upper surface of the second joint unit JU2 (assuming the planes parallel to the upper surface of the first joint unit JU1 and the second joint unit JU2 are parallel to each other). The average value of the steps of the plurality of joint units JU may be about 30 micrometers to about 200 micrometers.

If the plurality of joint units JU have a predetermined step from each other, one or more of the plurality of joint units JU may be visually recognized on the display surface IS (FIG. 1) of the display device DD. Additionally or alternatively, even when the joint units JU are omitted, stains or other visual indications may be visually recognized due to bending or the like between components of the display device. Since the display device DD of an embodiment includes the mesh pattern layer MS, the above-described issues may be alleviated or prevented.

Figure 5A:
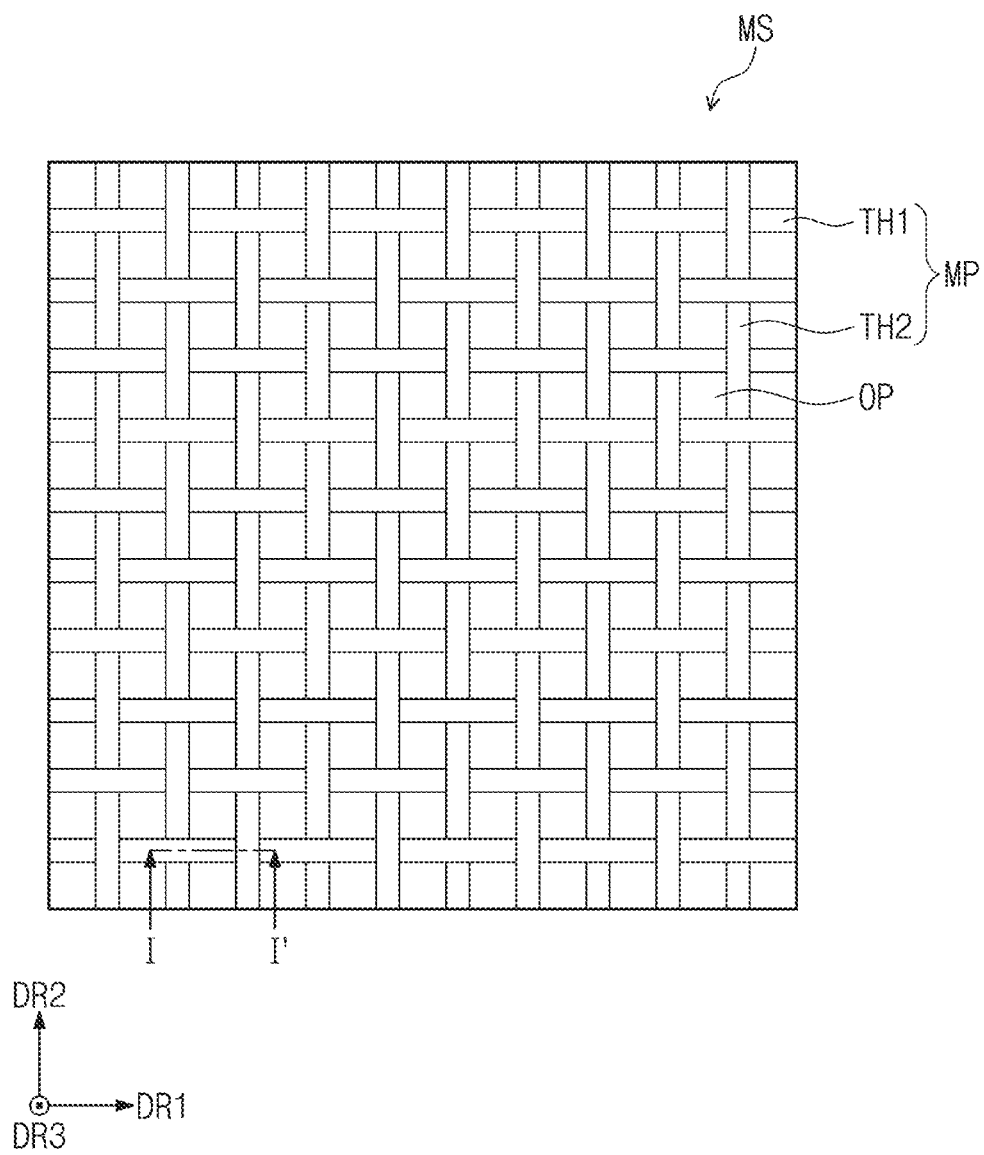
FIG. 5A is a plan view of a mesh pattern layer according to an embodiment of the inventive concept.
Figure 5B:
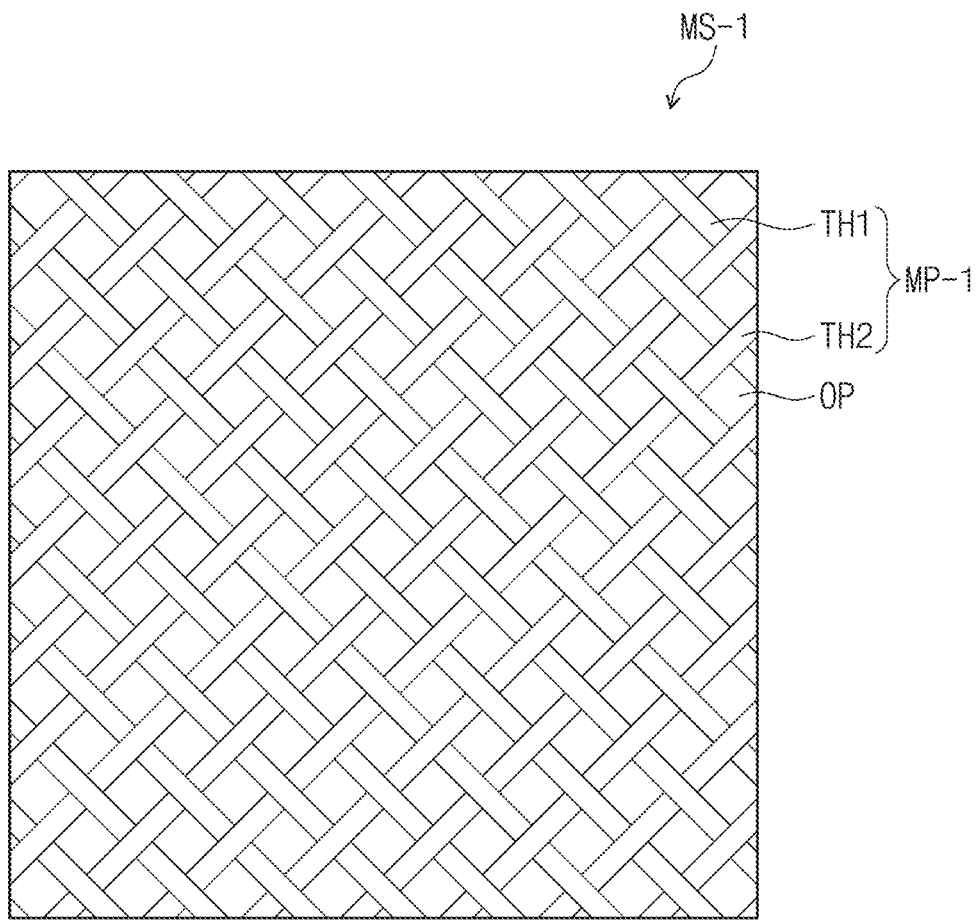
FIG. 5B is a plan view of a mesh pattern layer according to an embodiment of the inventive concept.
Figure 5C:
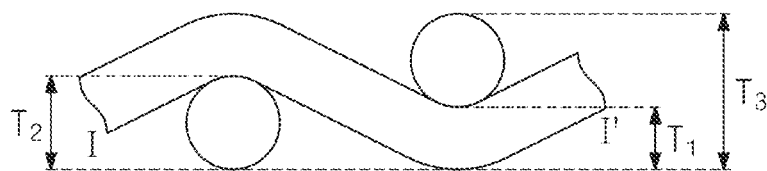
FIG. 5C is a sectional view of a mesh pattern layer according to an embodiment of the inventive concept.

FIG. 5A is a plan view of a mesh pattern layer MS according to an embodiment of the inventive concept. FIG. 5B is a plan view of a mesh pattern layer MS according to an embodiment of the inventive concept. FIG. 5C is a sectional view of a mesh pattern layer MS according to an embodiment of the inventive concept.

Referring to FIG. 5A, the mesh pattern layer MS may include a mesh pattern MP and a plurality of openings OP. The mesh pattern MP and the openings OP may be defined by a plurality of first yarns TH1 and a plurality of second yarns TH2. The openings OP may have the same shape and the same area.

Referring to FIG. 5A, the first yarns TH1 may extend in the first direction DR1. The first yarns TH may be spaced apart from each other at regular intervals in the second direction DR2. The second yarns TH2 may be extended to cross each of the first yarns TH1. The second yarns TH2 may be spaced apart from each other at regular intervals. For example, the second yarns TH2 may cross the first yarns TH1 in the second direction DR2 perpendicular to the first direction DR1. In this case, the openings OP may be defined in the form of a square or a rectangle when viewed in the third direction DR3.

However, this is merely illustrative, and the embodiment is not limited thereto. The first yarns TH1 and the second yarns TH2 may cross each other in various directions. If some or all of the openings OP have the same shape and the same area, the openings OP may be defined in other shapes, in addition to the rectangle.

The m-th first yarn TH1 of the first yarns TH may be disposed over the n-th second yarn TH2 of the second yarns TH2 and under the (n+1)-th second yarn TH2 of the second yarns TH2. Alternatively, the m-th first yarn TH1 of the first yarns TH may be disposed under the n-th second yarn TH2 of the second yarns TH2 and over the (n+1)-th second yarn TH2 of the second yarns TH2. Here, m and n are each an odd number equal to or greater than 1.

The (m+1)-th first yarn TH1 of the first yarns TH may be disposed over the n-th second yarn TH2 of the second yarns TH2 and under the (n+1)-th second yarn TH2 of the second yarns TH2. Alternatively, the (m+1)-th first yarn TH1 of the first yarns TH may be disposed under the n-th second yarn TH2 of the second yarns TH2 and over the (n+1)-th second yarn TH2 of the second yarns TH2.

For example, each of the first yarns TH1 may be arranged to cross the second yarns TH2 alternately up and down.

In an embodiment, since the display device DD includes the mesh pattern layer MS, stains or the joint units JU may be prevented from being visually recognized in the folding region FA. When the display device DD includes the openings OP, it is determined that the bending between the members of the display device DD and the steps between the joint units JU are reduced by the openings OP.

When the shape of the openings OP is a square, the length of one side of the opening may be equal to or greater than about 0.95 times and less than or equal to about 1.3 times the average step of the joint units JU. For example, the area of each of the openings OP may be about [the average step of the joint units×0.95]$^2$ to about [the average step of the joint units×1.3]$^2$.

With respect to the entire region of the mesh pattern layer MS, the higher the ratio of the openings OP, the more effective the step is reduced. Therefore, as the ratio of the openings OP is higher, the visibility of the display device DD may be increased. However, when the ratio of the opening OP is too high, the adhesion area of the mesh pattern layer MS becomes small. Therefore, adhesion of the mesh pattern layer MS may be degraded. When the area of each of the openings OP satisfies the above-described range, the adhesion area of the mesh pattern layer MS may be sufficiently secured while the visibility of the display device DD is increased.

Accordingly, an embodiment of the present disclosure includes a display device (e.g., display device DD) comprising a display module (e.g., display module DM); a plurality of joints (e.g., joint units JU) disposed under the display module, and configured to support folding of the display device; and a mesh pattern layer (e.g., mesh pattern layer MS of FIG. 5A or mesh pattern layer MS-1 of FIG. 5B) disposed between the display module and the joints, wherein the mesh pattern comprises a mesh pattern (e.g., mesh pattern MP of FIG. 5A or mesh pattern MP-1 of FIG. 5B) and a plurality of openings (e.g., openings OP) defined by the mesh pattern, and wherein the openings have an average size between a lower value determined based on a visibility parameter (i.e., a ratio of opening size to joint unit step sufficient to achieve improved visibility) and an upper value determined based on an adhesion parameter (i.e., a ratio of opening size to joint unit step small enough to achieve sufficient adhesion of the mesh pattern layer).

Since the mesh pattern layer MS includes the first yarns TH1 and the second yarns TH2, the process efficiency for forming the mesh pattern layer MS may be increased. The area of the openings OP may be adjusted by adjusting the interval between the first yarns TH1 and the second yarns TH2. The thickness of the mesh pattern layer MS may be adjusted by adjusting the thicknesses of the first yarns TH1 and the second yarns TH2.

However, in an embodiment, the mesh pattern MP may not be defined by the first yarns TH1 and the second yarns TH2. For example, the mesh pattern MP may be formed in an integral shape.

Referring to FIG. 5B, the first yarns TH1 may extend in a fourth direction DR4 crossing the first direction DR1 at an angle of about 30 to about 60 degrees. The fourth direction DR4 may be a direction between the first direction DR1 and the second direction DR2. For example, the fourth direction DR4 may be a direction that crosses the first direction DR1 at an angle of about 45 degrees. For example, the second yarns TH2 may cross the first yarns TH1 in a fifth direction DR5 perpendicular to the fourth direction DR4. In this case, the mesh pattern MP-1 may have a rhombus shape when viewed in the third direction DR3.

In a case where the mesh pattern layer MS-1 is formed as illustrated in FIG. 5B, when the mesh pattern layer MS-1 is pulled in the first direction DR1 or the second direction DR2, the mesh pattern layer MS-1 has a tensile strain higher than the mesh pattern layer MS illustrated in FIG. 5A.

Depending on the radius of curvature of the foldable display device DD, characteristics for the mesh pattern layers MS and MS-1 may vary. For example, for display device DD folded by inner-bending, as the radius of curvature decreases, the tensile strain of the mesh pattern layers MS and MS-1 may be high. Therefore, the mesh pattern layer MS-1 illustrated in FIG. 5B may be applied to the display device DD folded by inner-bending.

FIG. 5C is a sectional view of a mesh pattern layer MS according to an embodiment of the inventive concept. In FIG. 5C, a cross-section taken along line I-I' of FIG. 5A is illustrated.

Referring to FIG. 5C, the first yarns TH1 and the second yarns TH2 may have predetermined thicknesses $T_1$ and $T_2$, respectively. The mesh pattern layer MS may also have a predetermined thickness $T_3$. The thickness $T_1$ of the first yarn TH1 and the thickness $T_2$ of the second yarn TH2 may be the same or different from each other but may be the same. The thickness $T_3$ of the mesh pattern layer MS may be about 80 micrometers to about 150 micrometers. The shortest distance between a top of the first yarn TH1 and a bottom of the second yarn TH2 in an overlapping portion of the first yarn and the second yarn is between about 80 micrometers to about 150 micrometers.

When the thickness $T_3$ of the mesh pattern layer MS is 80 micrometers or less, since the opening OP does not have a sufficient thickness, the effect of improving visibility may be insufficient. When the thickness $T_3$ of the mesh pattern layer MS exceeds 150 micrometers, since the mesh pattern layer MS is plastically deformed during the folding process, the durability of the display device DD may be degraded.

The thickness $T_3$ of the mesh pattern layer MS may be smaller or larger than the sum of the thickness $T_1$ of the first yarn TH1 and the thickness $T_2$ of the second yarn TH2, depending on the degree of stretching. When the mesh pattern layer MS is strongly stretched, the first yarn TH1 and the second yarn TH2 may be pressed against each other. Therefore, the thickness $T_3$ of the mesh pattern layer MS may be smaller than the sum of the thickness $T_1$ of the first yarn TH1 and the thickness $T_2$ of the second yarn TH2. When the mesh pattern layer MS is weakly stretched, space may be created between the first yarn TH1 and the second yarn TH2. Therefore, the thickness $T_3$ of the mesh pattern layer MS may be larger than the sum of the thickness $T_1$ of the first yarn TH1 and the thickness $T_2$ of the second yarn TH2.

The first yarns TH1 and the second yarns TH2 may have a Young's modulus value of about 3 GPa to about 4 GPa. In an example scenario, when the modulus values of the first yarns TH1 and the second yarns TH2 are less than 3 GPa, the bending between the members of the display device DD or the steps of the joint units JU may not be sufficiently relaxed. When the modulus values of the first yarns TH1 and the second yarns TH2 exceeds 4 GPa, plastic deformation may occur in the first yarns TH1 and the second yarns TH2 during folding.

Each of the first yarns TH1 and the second yarns TH2 may include at least one of polyethylene terephthalate (PET), polyetheretherketone (PEEK), polyaniline (PA), or polypropylene (PP). When each of the first yarns TH1 and the second yarns TH2 includes polyethylene terephthalate (PET), polyaniline (PA), or polypropylene (PP), a crosslinking agent may be included to improve stiffness.

Figure 6A:
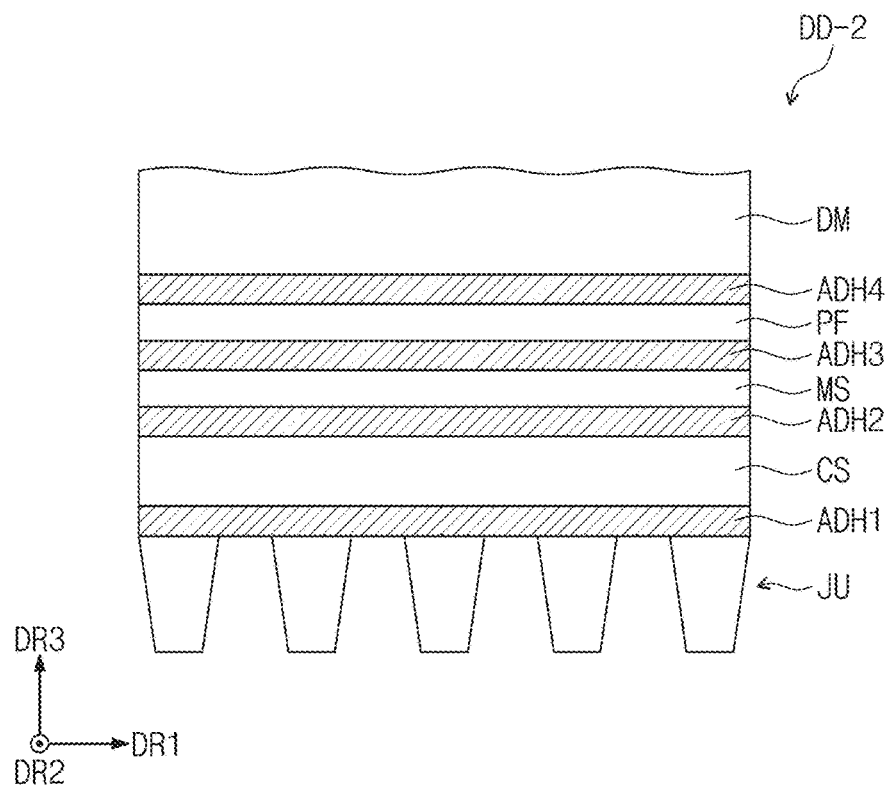
FIG. 6A is a sectional view of a display device according to an embodiment of the inventive concept.
Figure 6B:
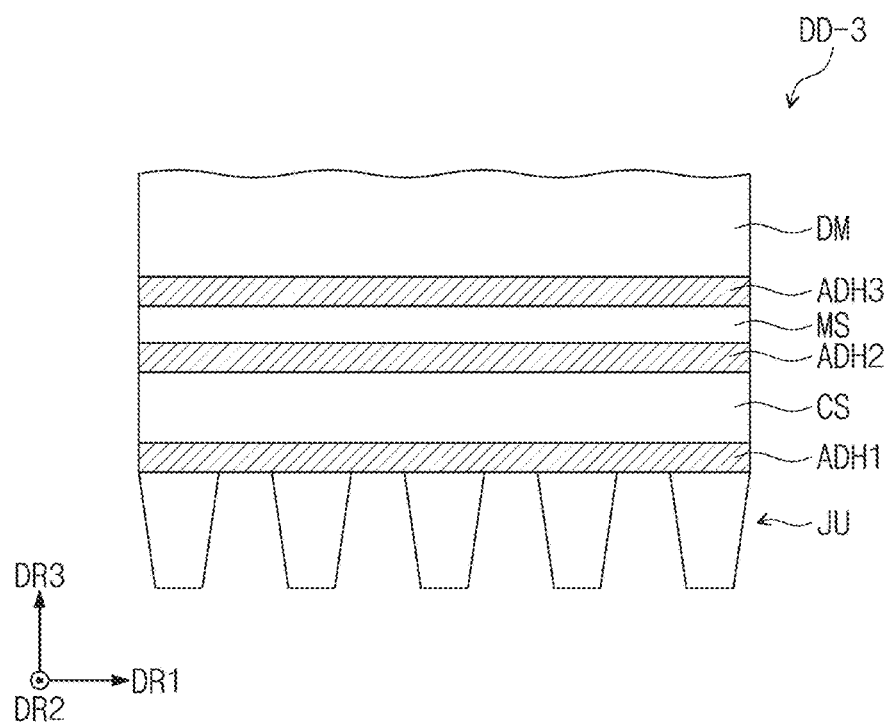
FIG. 6B is a sectional view of a display device according to an embodiment of the inventive concept.
Figure 6C:
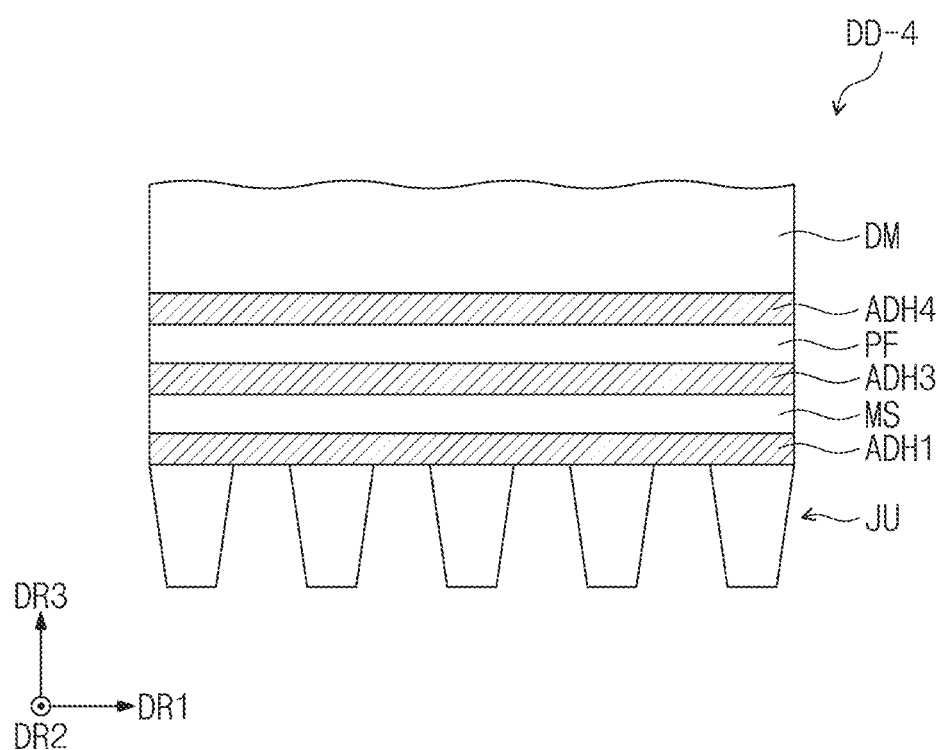
FIG. 6C is a sectional view of a display device according to an embodiment of the inventive concept.

FIG. 6A is a sectional view of a display device DD-2, according to an embodiment of the inventive concept. FIG. 6B is a sectional view of a display device DD-3, according to an embodiment of the inventive concept. FIG. 6C is a sectional view of a display device DD-4, according to an embodiment of the inventive concept.

Referring to FIGS. 6A to 6C, the display devices DD-2, DD-3, and DD-4, according to the embodiments, further include at least one member of a cushion layer CS or a protective film PF.

Referring to FIG. 6A, in the display device DD-2 of an embodiment, the cushion layer CS and the protective film PF may absorb external impact shock. Referring to FIG. 6A, the cushion layer CS is illustrated as being disposed under the mesh pattern layer MS, but the embodiment is not limited thereto. The cushion layer CS may be disposed over the mesh pattern layer CS.

The cushion layer CS may include a cushioning material for cushioning external impact. For example, the cushion layer CS may be provided by foaming. The cushion layer CS may include various compounds such as silicone resin.

The protective film PF may prevent external moisture from penetrating the display module DM and may absorb external impact. In FIG. 6A, the protective film PF is illustrated as being disposed over the mesh pattern layer MS, but the embodiment is not limited thereto. For example, the protective film PF may be disposed under the mesh pattern layer MS or between the mesh pattern layer MS and the cushion layer CS. The protective film PF may include a plastic film as a base layer. The protective film PF may include a plastic film containing any one selected from the group consisting of polyethersulfone (PES), polyacrylate, polyetherimide (PEI), polyethylenenaphthalate (PEN), polyethylene terephthalate (PET), polyphenylene sulfide (PPS), polyarylate, polyimide (PI), polycarbonate (PC), polyarylene ethersulfone, or a combination thereof.

Referring to FIG. 6A, a first adhesive layer ADH1 may be disposed between the joint units JU and the cushion layer CS. Although the first adhesive layer ADH1 is illustrated as being entirely disposed on the folding region FA, the first adhesive layer ADH1 may be disposed on the contact surface between the joint units JU and the cushion layer CS. A second adhesive layer ADH2 may be disposed between the cushion layer CS and the mesh pattern layer MS to allow the cushion layer CS and the mesh pattern layer MS to adhere to each other. A third adhesive layer ADH3 may be disposed between the mesh pattern layer MS and the protective film PF to allow the mesh pattern layer MS to adhere to the protective film PF. The second adhesive layer ADH2 and the third adhesive layer ADH3 may be provided in the form of an adhesive tape.

The openings OP of the mesh pattern layer MS may be filled with the resin when the second adhesive layer ADH2 and the third adhesive layer ADH3 are provided in the form of an adhesive resin. In this case, the effect of visibility of the display device DD may be reduced. The fourth adhesive layer ADH4 may be disposed between the protective film PF and the display module DM to allow the protective film PF to adhere to the display module DM. For the first to fourth adhesive layers ADH1, ADH2, ADH3, and ADH4, the same as the adhesive layer ADH may be applied.

The material constituting the protective film PF is not limited to plastic resins and may include an organic or inorganic composite material. The protective film PF may include a porous organic layer and an inorganic material filled in pores of the organic layer. The protective film PF may further include a functional layer provided on the plastic film. The functional layer may include a resin layer. The functional layer may be provided by a coating method.

Referring to FIG. 6B, the display device DD-3 of the embodiment may further include a cushion layer CS. In comparison with the display device DD-3 described with reference to FIG. 6A, the protective film PF may be omitted in the display device DD-2 illustrated in FIG. 6B. In this case, the mesh pattern layer MS may take the role of the protective film PF. Although the mesh pattern layer MS is illustrated as being disposed over the cushion layer CS, the mesh pattern layer MS may be disposed under the cushion layer CS.

Referring to FIG. 6C, the display device DD-4 of the embodiment may further include a protective film PF. In comparison with the display device DD-3 described with reference to FIG. 6A, the cushion layer CS may be omitted in the display device DD-4 illustrated in FIG. 6C. Since the mesh pattern layer MS includes a plurality of openings OP, an external impact may be effectively absorbed. Therefore, the mesh pattern layer MS may take the role of the cushion layer CS absorbing external impact. Although the mesh pattern layer MS is illustrated as being disposed under the protective film PF, in an embodiment, the mesh pattern layer MS may be disposed over the protective film PF.

Figure 7:
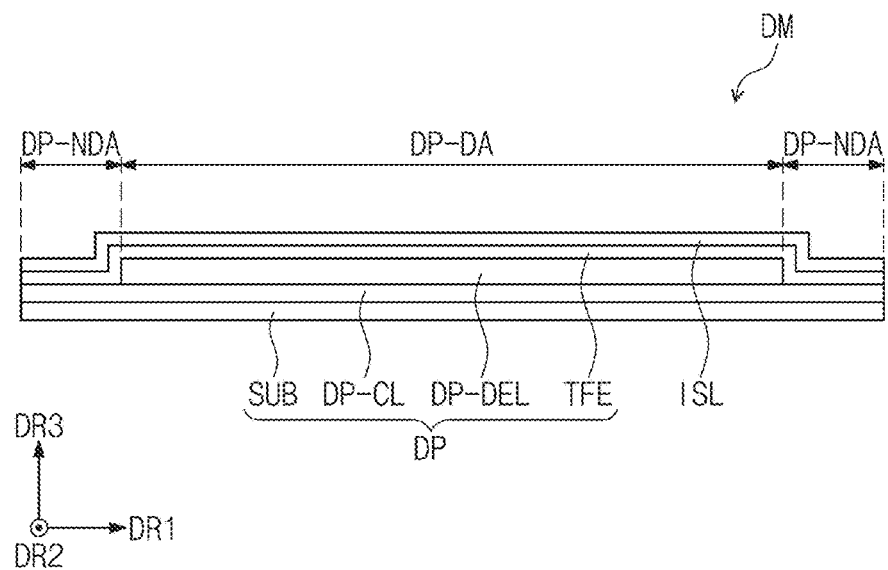
FIG. 7 is a sectional view of a display module according to an embodiment of the inventive concept.
Figure 8:
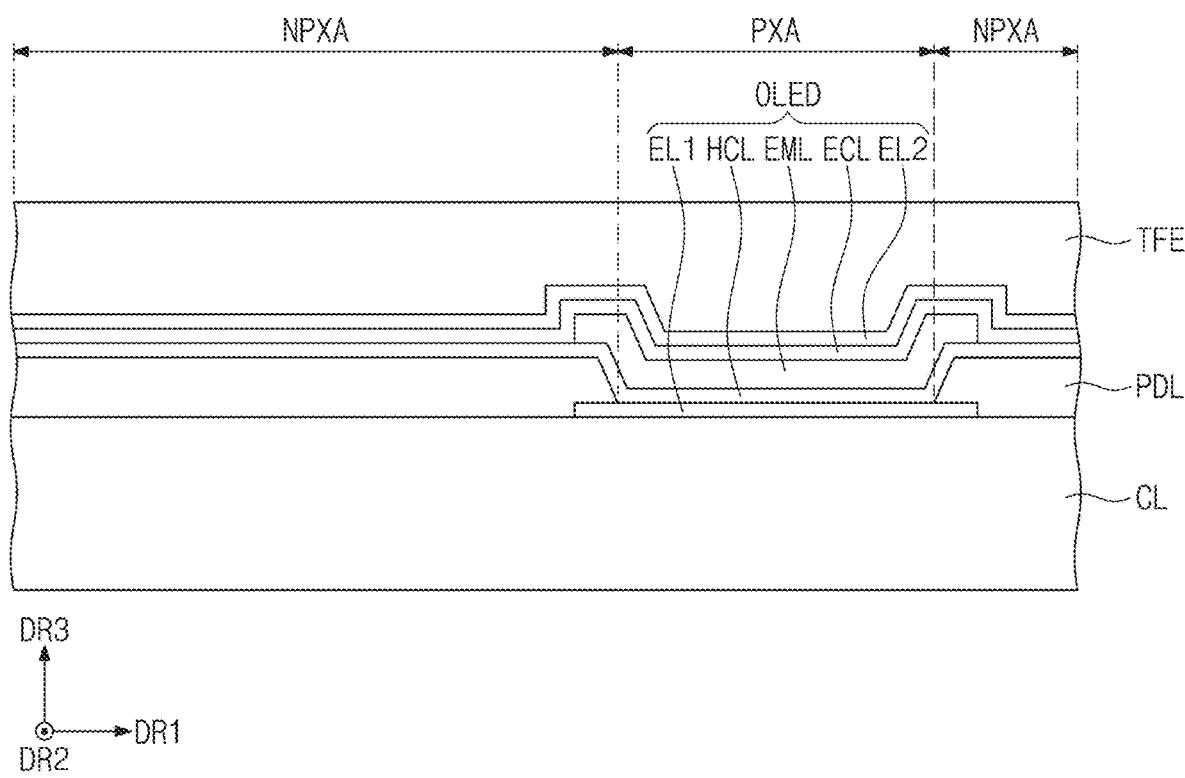
FIG. 8 is a sectional view of a display panel according to an embodiment of the inventive concept.

FIG. 7 is a sectional view of a display module DM according to an embodiment of the inventive concept. FIG. 8 is a sectional view of a display panel DP according to an embodiment of the inventive concept.

Referring to FIGS. 7 and 8, the display module DM may include the display panel DP and an input sensing layer ISL. The display panel DP may include a substrate SUB, a circuit element layer DP-CL, a display element layer DP-DEL, and a thin-film encapsulation layer TFE, which are sequentially stacked.

The display panel DP includes a display region DP-DA and a non-display region DP-NDA. The display region DP-DA of the display panel DP corresponds to the display region DD-DA illustrated in FIGS. 1A to 1C, and the non-display region DP-NDA corresponds to the non-display region DD-NDA illustrated in FIGS. 1A to 1C.

The substrate SUB may include at least one plastic film and is a flexible substrate and may include a plastic substrate, a glass substrate, a metal substrate, or an organic or inorganic composite substrate. Additionally or alternatively, the substrate SUB may include a synthetic resin film. The synthetic resin layer may include a thermosetting resin. The substrate SUB may have a multilayer structure. For example, the substrate SUB may have a three-layer structure of a synthetic resin layer, an adhesive layer, and a synthetic resin layer. Particularly, the synthetic resin layer may be a polyimide resin layer, and the material thereof is not particularly limited. The synthetic resin layer may include at least one of an acrylic resin, a methacrylic resin, polyisoprene, a vinyl resin, an epoxy resin, a urethane resin, a cellulose resin, a siloxane resin, a polyamide resin, or a perylene resin. Additionally or alternatively, the substrate SUB may include a glass substrate, a metal substrate, or an organic or inorganic composite substrate.

The circuit element layer DP-CL may include at least one intermediate insulating layer and a circuit element. The intermediate insulating layer includes at least one intermediate inorganic film and at least one intermediate organic film. The circuit element may include signal lines, a driving circuit of pixels, and the like.

The display element layer DP-DEL may include an organic light-emitting diode OLED. The organic light-emitting diode OLED may include a first electrode EL1, a hole transport layer HCL, an emission layer EML, an electron transport layer ECL, and a second electrode EL2, which are sequentially stacked. The first electrode EL1 may be an anode. Additionally or alternatively, the first electrode EL1 may be a pixel electrode. The emission layer EML may include an organic emission material, but the embodiment is not limited thereto. The emission layer EML may include an inorganic emission material such as a quantum dot or a quantum rod. The second electrode EL2 may be a common electrode or a cathode.

The organic light-emitting diode OLED may further include a capping layer disposed on the second electrode EL2. The capping layer CPL2 may be a layer for protecting the organic light-emitting diode OLED or adjusting optical characteristics.

The display element layer DP-DEL may further include an organic film, such as a pixel defining film PDL. The pixel defining film PDL may be disposed on the circuit element layer DP-CL to expose at least a portion of the first electrode El1. The pixel defining film PDL may define a light-emitting region PXA and a non-light-emitting region NPXA adjacent to the light-emitting region PXA.

The thin-film encapsulation layer TFE encapsulates the display element layer DP-DEL. The thin-film encapsulation layer TFE may be disposed directly on the organic light-emitting diode OLED. For example, the thin-film encapsulation layer TFE may be disposed directly on the second electrode EL2. Alternatively, when the organic light-emitting diode OLED further includes a capping layer (not illustrated), the thin-film encapsulation layer TFE may be disposed directly on the capping layer. The thin-film encapsulation layer TFE may include at least one organic layer and at least one inorganic layer. For example, the insulating layer may include a stacked structure of an inorganic layer, an organic layer, and an inorganic layer. The thin-film encapsulation layer TFE may protect the display element layer DP-DEL from foreign substances such as moisture, oxygen, and dust particles.

The input sensing layer ISL may be disposed over the display panel DP. Although not illustrated, the input sensing layer ISL may include an insulating layer and a conductive layer. A base insulating layer may be disposed at the lower portion of the input sensing layer ISL. The base insulating layer may be an inorganic insulating layer.

A continuous process may be used to manufacture the input sensing layer ISL and the display panel DP. The input sensing layer ISL may be disposed directly on the display panel DP. In the present disclosure, the expression "the A configuration is disposed directly on the B configuration" means that the adhesive layer is not disposed between the A configuration and the B configuration, and the A configuration and the B configuration are in contact with each other.

The input sensing layer ISL, according to an embodiment, may sense an external input by sensing a capacitance changed by an external object. For example, the input sensing layer ISL may be a capacitive input sensing layer ISL.

An input sensing layer ISL, according to another embodiment of the inventive concept, may sense an external input by sensing a change in pressure by an external object. For example, the input sensing layer ISL may be a decompression-type input sensing layer ISL.

FIGS. 9A to 9D are views illustrating display devices DD with and without a mesh pattern layer MS for visibility comparison. FIGS. 10A to 10D are views illustrating display devices DD according to the areas of openings OP for visibility comparison. FIG. 11 is a graph showing changes in tensile strain and tensile stress in an extending direction of the mesh pattern layer MS.

In the following description, the display device DD, according to an embodiment of the inventive concept, will be described by describing examples of the inventive concept and comparative examples with reference to FIGS. 9A to 9D, FIGS. 10A to 10D, and FIG. 11. Additionally or alternatively, the examples shown below are merely illustrative for an understanding of the inventive concept, and the scope of the inventive concept is not limited to the examples.

Manufacture of Display Devices According to Example 1 and Comparative Example 1

A mesh pattern layer was prepared using first yarns and second yarns containing PEEK. The prepared mesh pattern layer was disposed between the cushion layer and the joint units to manufacture the display device of Example 1. The display device of Example 1 was manufactured to have a stacked structure of the joint units, the cushion layer, the mesh pattern layer and the display module. Components adhered to each other by using adhesive members. The display device, according to Example 1, is a foldable display device with a radius of curvature of 4 mm.

A display device of Comparative Example 1 is manufactured to have the same configuration as the display device of Example 1, except that the mesh pattern layer is not included.

Evaluation of Visibility of Display Devices According to Example 1 and Comparative Example 1

For display devices according to Example 1 and Comparative Example 1, in an environment with a temperature of about 60° C. and a relative humidity of about 93%, folding and unfolding operations (first operation and second operation) were repeated about 150,000 times such that the display surface of the display device is exposed to the outside.

Figure 9A:
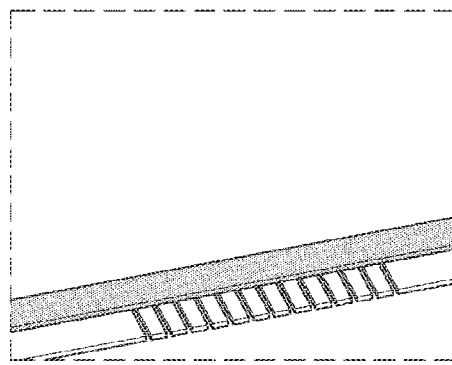
FIGS. 9A to 9D are views illustrating display devices with and without a mesh pattern layer for visibility comparison.
Figure 9B:
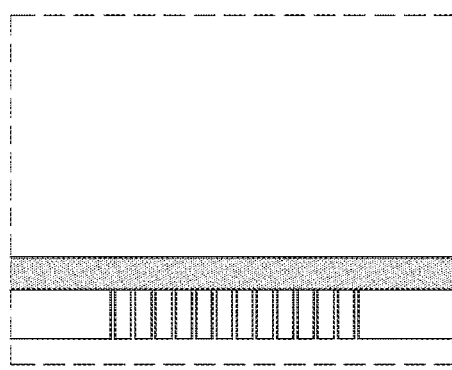
Figure 9C:
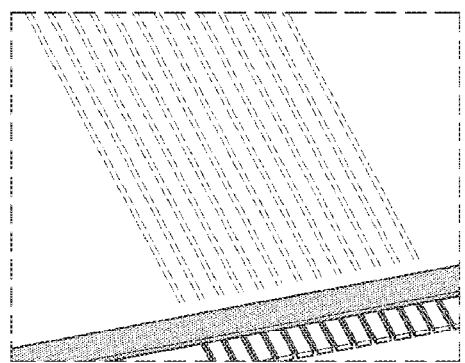
Figure 9D:
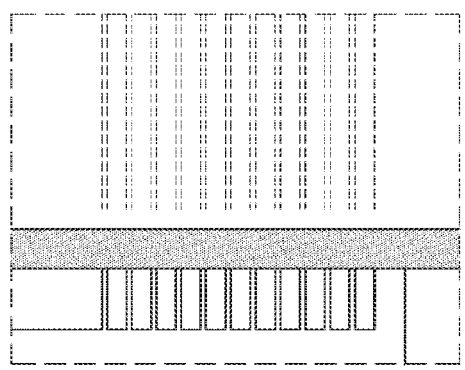

FIG. 9A illustrates the visible state before folding of the display device according to Example 1, and FIG. 9B illustrates the visible state after folding of the display device according to Example 1. FIG. 9C illustrates the visible state before folding of a display device according to Comparative Example 1, and FIG. 9D illustrates the visible state after folding of the display device according to Comparative Example 1.

Referring to FIGS. 9A and 9C, the joint units are not visually recognized before folding in the display device of Example 1, but the joint units may be visually recognized before folding in the display device of Comparative Example 1. Referring to FIGS. 9B and 9D, the joint units are not visually recognized after folding in the display device of Example 1, but the joint units are visually recognized after folding in the display device of Comparative Example 1. Referring to FIGS. 9A to 9D, the visibility of the joint units of the display device of Example 1, including the mesh pattern layer, may be improved compared to the display device of Comparative Example 1 that does not include the mesh pattern layer.

Evaluation of Visibility of Display Devices According to Areas of Openings of Mesh Pattern Display devices, according to Example 2 and Comparative Examples 2 to 4, including mesh pattern layers with different opening widths, are manufactured. In the display devices, according to Example 2 and Comparative Examples 2 to 4, the average step of the joint units was measured to about ±500 micrometers. The widths, the open ratios, and the thicknesses of the mesh pattern layer of the openings of the display devices, according to Example 2 and Comparative Examples 2 to 4, are described in Table 1 below.

TABLE 1

| | Opening Width($\mu m^2$) | Opening Rate (%) | Thickness of Pattern Layer ($\mu m$) |
|---|---|---|---|
| Example 2 | 10,000 | 34 | 125 |
| Comparative Example 2 | 196 | | 75 |
| Comparative Example 3 | 1225 | 22 | 71 |
| Comparative Example 4 | 48400 | 56 | 128 |

Figure 10A:
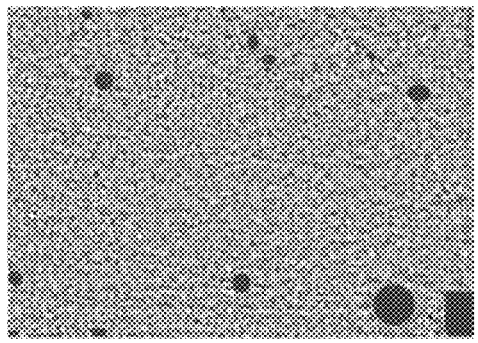
FIGS. 10A to 10D are views illustrating display devices according to the areas of openings for visibility comparison.
Figure 10B:
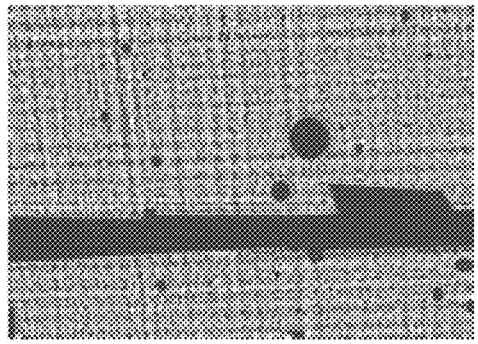
Figure 10C:
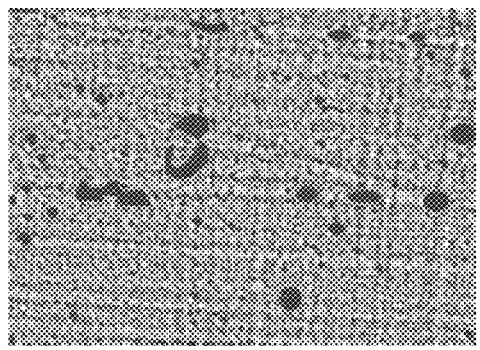
Figure 10D:
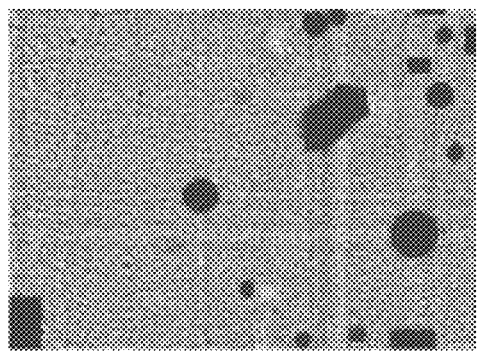
Figure 11:
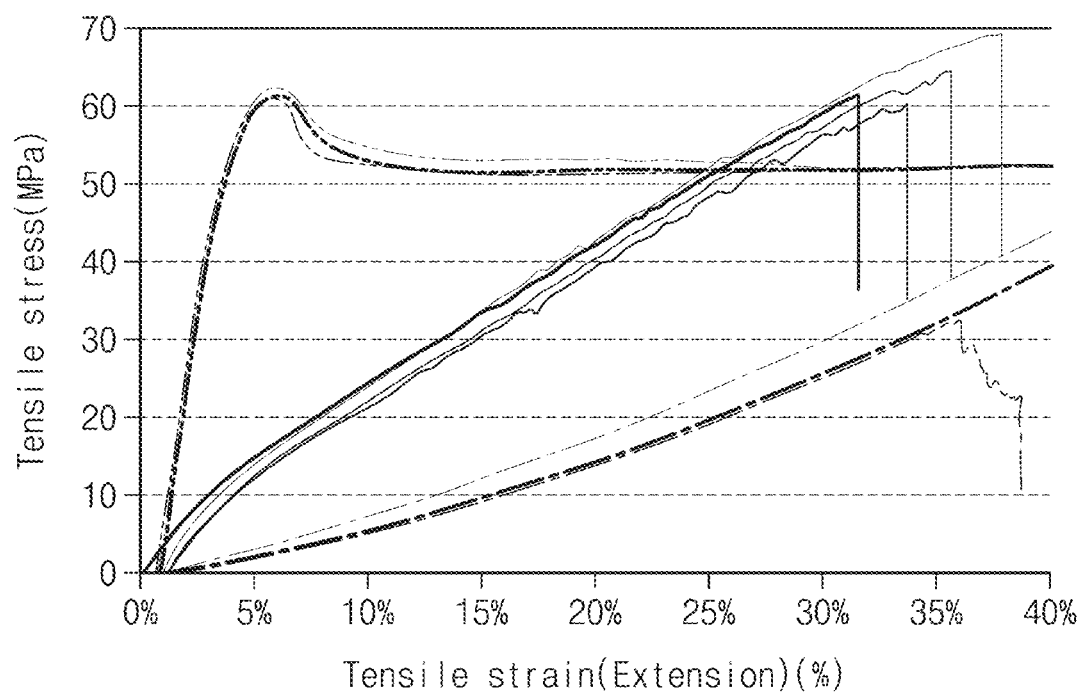
FIG. 11 is a graph showing tensile strain and tensile stress in an extending direction of the mesh pattern layer.

FIG. 10A illustrates a visible state before folding of the display device of Example 2, FIG. 10B illustrates a visible state before folding of the display device of Comparative Example 2, FIG. 10C illustrates a visible state before folding of the display device of Comparative Example 3, and FIG. 10D illustrates a visible state before the folding of the display device of Comparative Example 4. Referring to FIG. 10A, in the case of Example 2 in which the width of the opening has a value of (the average step of the joint units)$^2$, the shape of the mesh pattern is not observed. Referring to FIGS. 10B to 10D, in Comparative Examples 2 to 4 in which the width of the opening does not satisfy a value of about (the average step of the joint units×0.95)$^2$ to about (the average step of the joint units×1.3)$^2$, the shape of the mesh pattern is observed.

In the case of Example 2, since the width of the opening satisfies a value of about (the average step of the joint units×0.95)$^2$ to about (the average step of the joint units×1.3)$^2$, the opening area may be secured in a ratio sufficient to improve visibility, and sufficient that the adhesion area is sufficiently secured. According to the case of Comparative Example 2 and Comparative Example 3, if the ratio of the opening area is too small, the visibility may not be increased. According to the case of Comparative Example 4, if the ratio of the opening area is too high, the adhesive area of the mesh pattern layer may not be sufficiently secured. Accordingly, the adhesion of the mesh pattern layer is degraded, and the mesh pattern may be visually recognized.

As a result, the display device of Example 2, in which the width of the opening satisfies a value of about (the average step of joint units×0.95)$^2$ to about (the average step of the joint units×1.3)$^2$, has excellent visibility compared with the display devices of Comparative Examples 2 to 4 that do not satisfy the above values.

Tension Strain and Tensile Stress in Extending Direction of Mesh Pattern Layer

Referring to FIG. 11, a graph is shown in which tensile strain and tensile stress are presented in an extending direction of the mesh pattern layer. As described with reference to FIG. 5A, the mesh pattern layer of FIG. 11 is manufactured such that the opening has a rectangular shape. Yarns constituting the mesh pattern layer contain PEEK.

In FIG. 11, when the extending direction is the horizontal direction or the vertical direction (the first direction or the second direction), the tensile strain and the tensile stress are indicated by solid lines. When the extending direction is a direction inclined by about 45 degrees with respect to the horizontal direction (the fourth direction or the fifth direction), the tensile strain and the tensile stress are indicated by single-dashed lines. Tensile strain and tensile stress of the yarns constituting the mesh pattern are indicated by double-dashed lines.

Referring to FIG. 11, the yarns constituting the mesh pattern layer start the plastic deformation when the tensile strain exceeds about 6%. When the mesh pattern layer is extended in the vertical or horizontal direction, the mesh pattern layer starts plastic deformation from when the tensile strain is about 30% to about 40%. When the mesh pattern layer is extended in a direction inclined by about 45 degrees with respect to the horizontal direction, the mesh pattern layer does not start plastic deformation even when the tensile strain is about 40% or more.

In some cases, the elastic range of the mesh pattern layer MS-1 may be wider than the mesh pattern layer MS. Accordingly, the second yarns TH2 extend in the fourth direction DR4 crossing the first direction DR1 at an angle of about 45 degrees and the first yarns TH1 extend in the fifth direction DR5 perpendicular to the fourth direction DR4 to cross each of the second yarns TH2. Additionally or alternatively, the first yarns TH1 extend in the first direction DR1 and the second yarns TH2 extend in the second direction DR2 perpendicular to the first direction D1 to cross each of the first yarns TH1. Accordingly, even when the radius of curvature is small, the damage due to deformation may be decreased.

The display device, according to an embodiment of the inventive concept, includes a mesh pattern layer disposed between a display module and a plurality of joint units. The mesh pattern layer includes a mesh pattern and a plurality of openings defined by the mesh pattern. Therefore, the display device, according to an embodiment of the inventive concept, may have improved visibility.

Additionally or alternatively, the exemplary embodiments disclosed in the present invention are not intended to limit the technical idea of the present invention, and all technical ideas within the scope of the following claims and equivalents thereof should be construed as being included in the scope of the present invention.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display device comprising:
 a display module including a folding region and a non-folding region; and
 a mesh pattern overlapping the folding region and including a plurality of first yarns extending in a first direction and a plurality of second yarns extending in a second direction crossing the first direction,
 wherein each of the plurality of first yarns is arranged to cross the plurality of second yarns alternately up and down, and wherein a shortest distance between a top of a first yarn and a bottom of a second yarn in an overlapping portion of the first yarn and the second yarn is between 80 micrometers and 150 micrometers; and
 the plurality of second yarns extends in the second direction crossing the first direction at an angle of between 30 and 60 degrees.

2. The display device of claim 1, wherein the mesh pattern overlaps the folding region and the non-folding region.

3. The display device of claim 1, wherein the mesh pattern overlaps the folding region and does not overlap the non-folding region.

4. The display device of claim 1, wherein each of the plurality of first yarns and the plurality of second yarns has a modulus of between 3 GPa and 4 GPa.

5. The display device of claim 1, wherein each of the plurality of first yarns and the plurality of second yarns includes polyethylene terephthalate (PET), polyetheretherketone (PEEK), polyaniline (PA), and polypropylene (PP).

6. The display device of claim 1, further comprising:
 a plurality of joint units disposed under the mesh pattern and in which openings are defined, wherein
 at least one of the plurality of joint has a predetermined step between the at least one of the plurality of joint units and a neighboring joint unit of the plurality of joint units, and
 an area of each of the openings is between (an average step of the joint units×0.95)$^2$ and (the average step of the joint units×1.3)$^2$.

7. The display device of claim 6, wherein each of the openings has a same shape and a same area in a plan view.

8. The display device of claim 6, wherein the plurality of joint units are spaced apart from each other at regular intervals.

9. The display device of claim 1, wherein
 the display module includes:
 a display element layer;
 a thin-film encapsulation layer encapsulating the display element layer; and
 an input sensing layer disposed directly on the thin-film encapsulation layer.

10. The display device of claim 1, wherein the folding region is foldable based on at least one of an inner-bending and an outer-bending.

11. The display device of claim 1, further comprising:
 at least one of a film layer or a cushion layer disposed under the display module.

12. The display device of claim 11, further comprising:
 the film layer disposed between the display module and the mesh pattern.

13. The display device of claim 11, wherein:
 the cushion layer is disposed under the mesh pattern.

14. The display device of claim 1, further comprising:
 a window disposed over the display module and overlapping the folding region and the non-folding region.

15. A display device comprising:
 a display module including a folding region and a non-folding region; and
 a mesh pattern overlapping the folding region and including a plurality of first yarns extending in a first direction and a plurality of second yarns extending in a second direction crossing the first direction, wherein:

each of the plurality of first yarns is arranged to cross the plurality of second yarns alternately up and down, and wherein a shortest distance between a top of a first yarn and a bottom of a second yarn in an overlapping portion of the first yarn and the second yarn is between 80 micrometers and 150 micrometers; and a plurality of joint units disposed under the mesh pattern and in which openings are defined, wherein:

at least one of the plurality of joint has a predetermined step between the at least one of the plurality of joint units and a neighboring joint unit of the plurality of joint units, and an area of each of the openings is between (an average step of the joint units×0.95)$^2$ and (the average step of the joint units×1.3)$^2$.

16. The display device of claim 15, wherein each of the openings has a same shape and a same area in a plan view.

17. The display device of claim 15, wherein the plurality of joint units are spaced apart from each other at regular intervals.

18. A display device comprising:

a display module including a folding region and a non-folding region; and a mesh pattern disposed below the display module and overlapping the folding region and including a plurality of first yarns extending in a first direction and a plurality of second yarns extending in a second direction crossing the first direction, wherein each of the plurality of first yarns is arranged to cross the plurality of second yarns alternately up and down, and wherein a shortest distance between a top of a first yarn and a bottom of a second yarn in an overlapping portion of the first yarn and the second yarn is between 80 micrometers and 150 micrometers; and the first direction crosses a third direction corresponding to an edge of the display module at an angle of about 45 degrees.

* * * * *